(12) United States Patent
Yamamoto et al.

(10) Patent No.: US 8,366,457 B2
(45) Date of Patent: Feb. 5, 2013

(54) WIRING STRUCTURE HAVING A PLURALITY OF CIRCUIT BOARDS WITH AN INSULATING SLEEVE IN A TERMINAL INSERTION HOLE

(75) Inventors: Takeyoshi Yamamoto, Saitama (JP);
Keisuke Takahashi, Saitama (JP);
Yoshikatsu Hasegawa, Saitama (JP)

(73) Assignees: Honda Motor Co., Ltd., Tokyo (JP);
Furukawa Automotive Systems Inc., Shiga (JP)

( * ) Notice: Subject to any disclaimer, the term of this patent is extended or adjusted under 35 U.S.C. 154(b) by 0 days.

(21) Appl. No.: 13/233,160

(22) Filed: Sep. 15, 2011

(65) Prior Publication Data

US 2012/0077359 A1  Mar. 29, 2012

(30) Foreign Application Priority Data

Sep. 29, 2010  (JP) ................................ 2010-218632

(51) Int. Cl.
*H01R 12/00* (2006.01)
(52) U.S. Cl. ................................. 439/76.2
(58) Field of Classification Search .............. 439/76.1, 439/76.2, 82, 787; 174/261, 255; 361/764, 361/784

See application file for complete search history.

(56) References Cited

U.S. PATENT DOCUMENTS

| | | | | |
|---|---|---|---|---|
| 3,162,500 | A * | 12/1964 | Pittman | 439/45 |
| 6,283,769 | B1 * | 9/2001 | Asao et al. | 439/76.2 |
| 7,643,297 | B2 * | 1/2010 | Tominaga et al. | 361/704 |
| 7,943,859 | B2 * | 5/2011 | Ambo et al. | 174/261 |
| 8,109,772 | B2 * | 2/2012 | Lin | 439/76.1 |
| 2007/0218257 | A1 | 9/2007 | Ambo | |
| 2011/0116248 | A1 * | 5/2011 | Ambo et al. | 361/796 |
| 2011/0120756 | A1 | 5/2011 | Ambo et al. | |

FOREIGN PATENT DOCUMENTS

JP    2009-164632    7/2009

* cited by examiner

*Primary Examiner* — Chandrika Prasad
(74) *Attorney, Agent, or Firm* — Renner, Otto, Boisselle & Sklar, LLP

(57) ABSTRACT

A wiring structure includes a board assembly and pin terminals. In each of pin terminal insertion holes formed in the board assembly, a terminal connection portion electrically connected to a metal foil wire and fitted onto the pin terminal so as to hold the pin terminal is provided in a through-hole of at least one of a plurality of circuit boards forming the board assembly, which forms a part of the pin terminal insertion hole, whereas an insulating sleeve blocking contact between the pin terminal and each of the remaining circuit boards is fitted into through-holes of the remaining circuit boards, which form the remaining part of the pin terminal insertion hole.

14 Claims, 9 Drawing Sheets

WIRING STRUCTURE HAVING A PLURALITY OF CIRCUIT BOARDS WITH AN INSULATING SLEEVE IN A TERMINAL INSERTION HOLE

CROSS-REFERENCE TO RELATED APPLICATION

This application claims priority to Japanese Patent Application No. 2010-218632 filed on Sep. 29, 2010, the disclosure of which including the specification, the drawings, and the claims is hereby incorporated by reference in its entirety.

BACKGROUND

The present disclosure relates to a wiring structure and a joint box including the wiring structure.

Recently, a plurality of electronic parts have been used for an electrical product or an automobile (vehicle), and many wires are connected to the electronic parts. Thus, a joint box has been proposed, which unifies a wire connection and unifies a power supply.

For example, Japanese Patent Publication No. 2009-164632 discloses a joint box using circuit boards, which is configured as follows. A plurality of circuit boards are stacked, each of which is provided with a metal foil wire on a three-dimensionally molded resin plate made of synthetic resin, and pin terminal insertion holes are formed in the stacked circuit boards. A receiving terminal made of metal is attached to a through-hole defining the pin terminal insertion hole of a certain circuit board. A tab provided with the receiving terminal is connected to the metal foil wire of the circuit board. Then, a pin terminal is inserted into the pin terminal insertion hole, and is electrically connected to the metal foil wire of the circuit board through the receiving terminal. The joint box is connected to an electronic circuit unit provided therein or adjacent thereto through the protruding pin terminal.

SUMMARY

A wiring structure of the present disclosure includes a board assembly in which a plurality of circuit boards each including a metal foil wire on an insulating board are stacked, and a pin terminal insertion hole is formed by overlapping through-holes formed in the plurality of circuit boards with each other in a board thickness direction; and a pin terminal inserted into the pin terminal insertion hole of the board assembly. In the pin terminal insertion hole, a terminal connection portion electrically connected to the metal foil wire of the circuit board and fitted onto the pin terminal inserted into the pin terminal insertion hole so as to hold the pin terminal is provided in the through-hole of at least one of the plurality of circuit boards, which forms a part of the pin terminal insertion hole, and at least one insulating sleeve blocking contact of the pin terminal inserted into the pin terminal insertion hole with the remaining circuit boards is fitted into the through-holes of the remaining circuit boards, which form the remaining part of the pin terminal insertion hole.

A joint box of the present disclosure includes a wiring structure and a housing in which the wiring structure is accommodated so that the pin terminal protrudes from the housing. A connector attachment portion including the pin terminal protruding from the housing is provided on an outer surface of the housing.

Features and advantages of the present disclosure will be apparent from the following description and the accompanying drawings.

DETAILED DESCRIPTION

An embodiment will be described in detail below.

Figure 1:
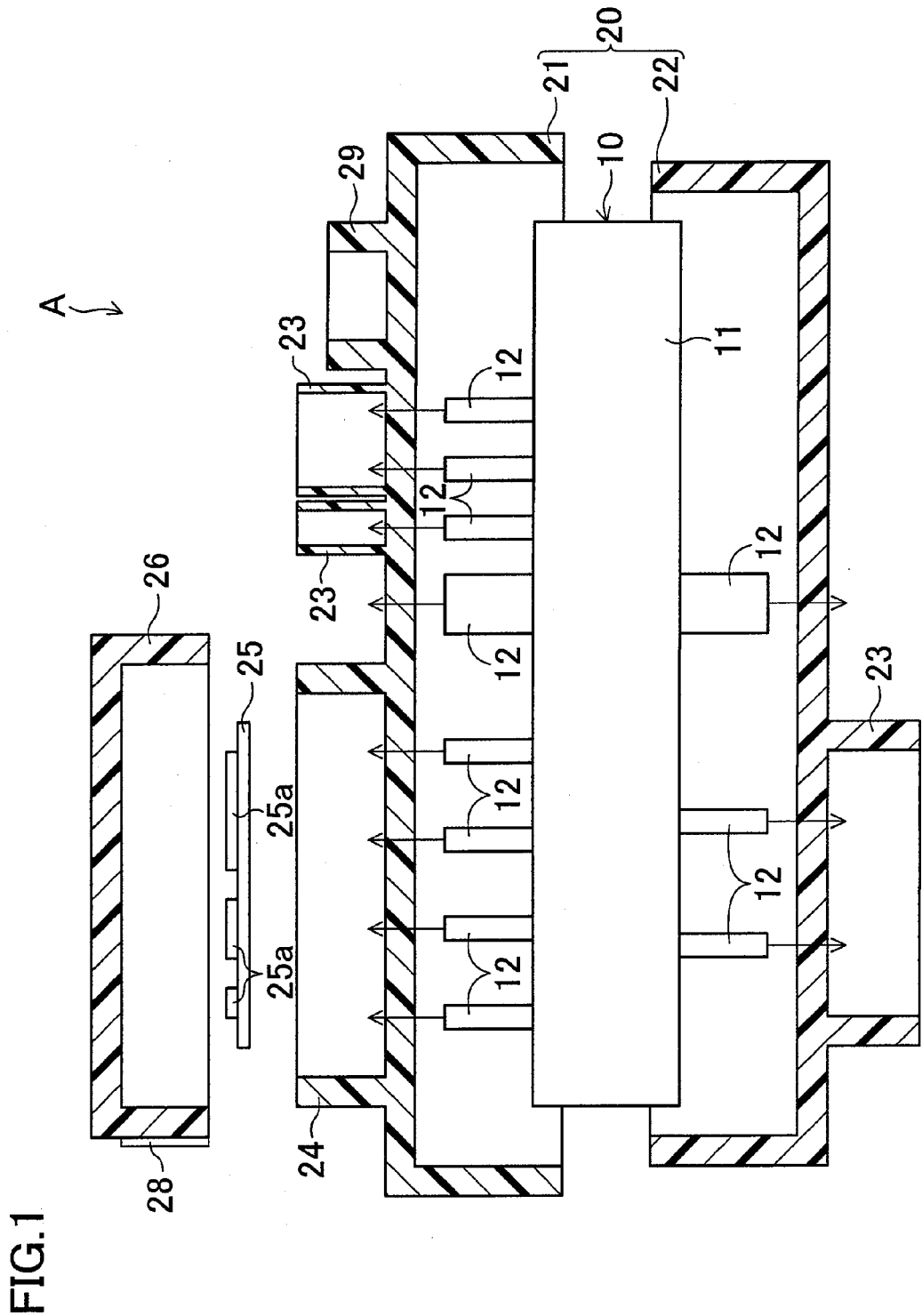
FIG. 1 is a schematic cross-sectional view of a joint box of an embodiment.

FIG. 1 illustrates a joint box A of the present embodiment.

The joint box A of the present embodiment is installed in an electrical product or an automobile (vehicle), and is connected to a connector provided in each of many wires extending from electronic parts, power sources, etc. The joint box A is configured to unify a wire connection and unify a power supply.

In the joint box A of the present embodiment, a wiring structure 10 which is a thick plate-shaped member is accommodated in a housing 20.

In the wiring structure 10, a plurality of pin terminals 12 are provided in a board assembly 11. In the board assembly 11, a plurality of circuit boards 13 are stacked.

Figure 2A:
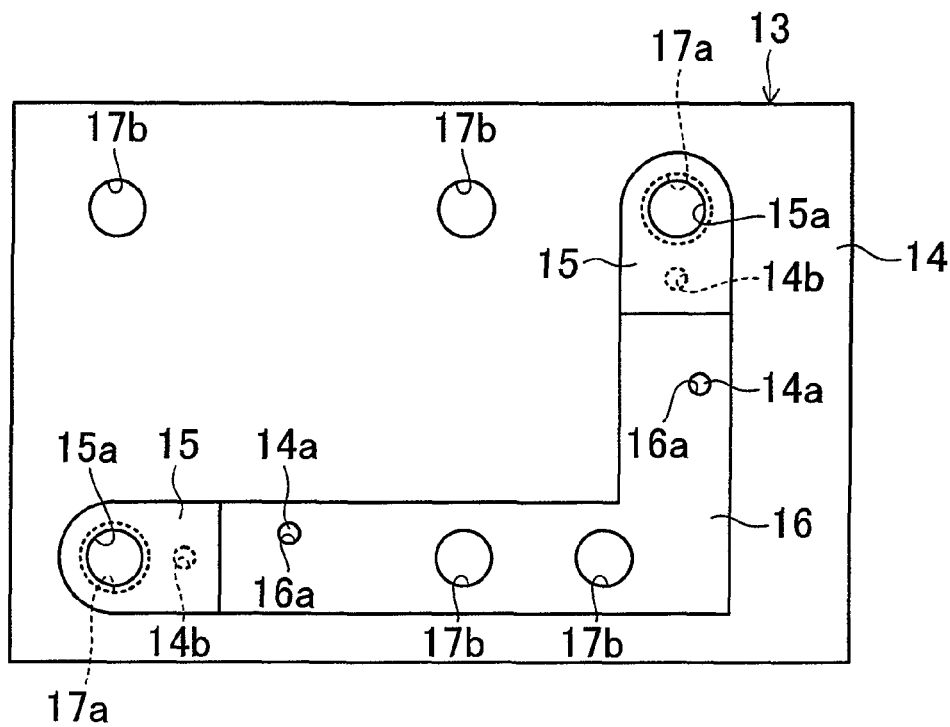
FIGS. 2A and 2B are schematic plan views illustrating an example of a circuit board and another example of the circuit board.
Figure 2B:
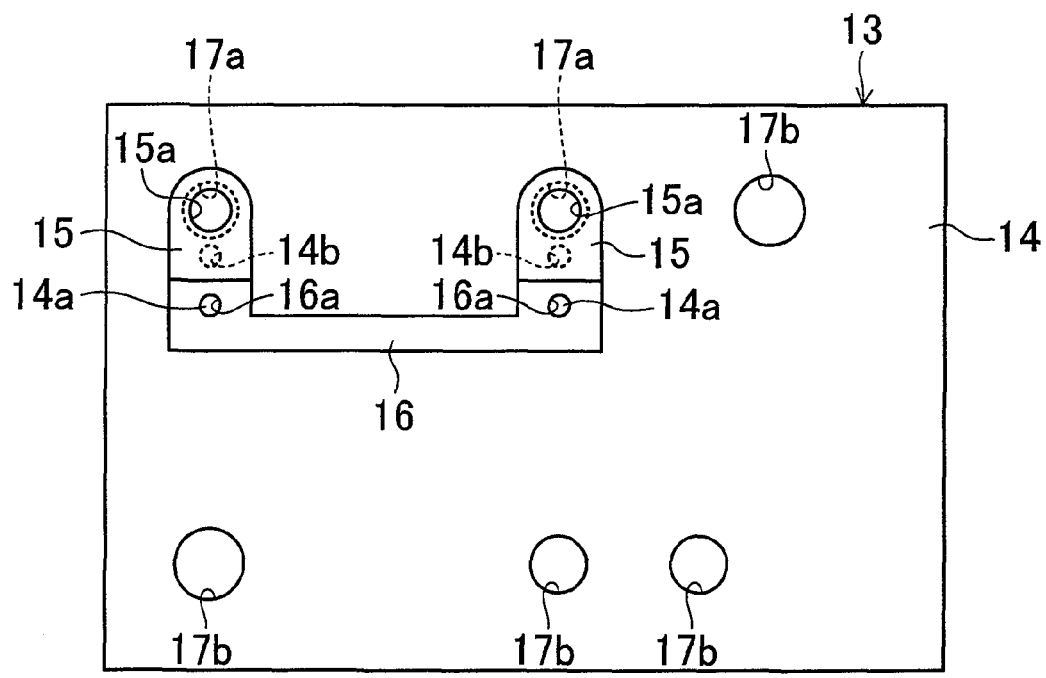

FIGS. 2A and 2B illustrate an example of the circuit board 13 and another example of the circuit board 13, respectively.

In each of the plurality of circuit boards 13, a metal foil wire 16 to which receiving terminals 15 are attached at both ends thereof is provided on an insulating board 14. Note that the metal foil wire 16 may be provided only on one side of the insulating board 14 of the circuit board 13, or may be provided on both sides of the insulating board 14. The receiving terminals 15 are not necessarily provided at the both ends of the metal foil wire 16 as illustrated in FIG. 2 as long as the receiving terminal 15 is electrically connected to the metal foil wire 16. In addition, the number of receiving terminals 15 to be connected is not limited.

Figure 3A:
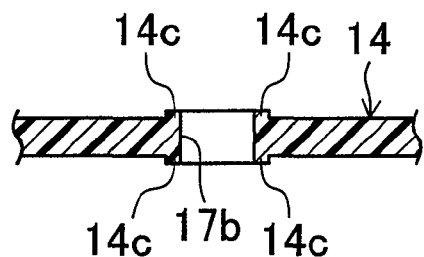
FIGS. 3A and 3B are partial cross-sectional views of a terminal insertion through-hole of an insulating board.
Figure 3B:
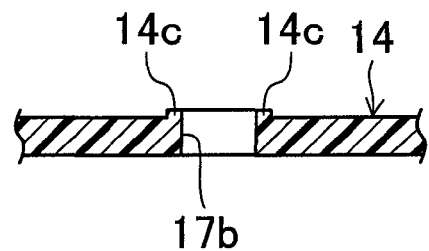

The insulating board 14 is made of, e.g., resin material. The resin material forming the insulating board 14 may be thermoplastic resin or thermoset resin. However, if the thermoset resin such as epoxy resin is used, cutting etc. are required when forming recessed and raised portions in the board, thereby complicating a board forming process and wasting material. Thus, the thermoplastic resin is preferably used because the recessed and raised portions can be easily formed in the board by injection molding using a mold devised for forming the recessed and raised portions and no material is wasted. Considering a heat resistance property, polypropylene resin is preferably used as the thermoplastic resin. Considering a shape retaining property, polypropylene resin containing talc of 20% by mass is more preferably used. The thickness of the insulating board 14 is, e.g., 1-5 mm. Terminal insertion through-holes 17a, 17b into each of which the pin terminal is inserted are formed in each of the insulating boards 14 of the circuit boards 13 so that positions of the terminal insertion through-holes 17a, 17b in one of the insulating boards 14 correspond to those in the remaining insulating boards 14. As the terminal insertion through-holes 17a, 17b, there are the terminal insertion through-holes 17a electrically connected together through the receiving terminals 15 and the metal foil wire 16 and the terminal insertion through-holes 17b which are different from the terminal insertion through-holes 17a. The diameter of the terminal insertion through-hole 17a, 17b is, e.g., 1-10 mm. The terminal insertion through-hole 17a, 17b is formed in, e.g., a circular shape, a rectangular shape, a slit-like shape, etc. corresponding to the shape of the pin terminal 12. A plurality of positioning protrusions 14a for positioning the wires are provided on the insulating board 14, and a terminal welding hole 14b is formed near each of the terminal insertion through-holes 17a electrically connected together through the receiving terminals 15 and the metal foil wire 16. As illustrated in, e.g., FIGS. 3A and 3B, in the insulating board 14, an inter-board clearance maintaining raised portion 14c may be provided, e.g., around each of the terminal insertion through-holes 17b which are not electrically connected to the metal foil wire 16 as a spacer for ensuring insulation between the metal foil wires 16 of the circuit boards 13 adjacent to each other.

The metal foil wire 16 is made of, e.g., metal foil formed by blanking. The thickness of the metal foil wire 16 is, e.g., 0.01-2.0 mm. A positioning hole 16a is formed corresponding to the positioning protrusion 14a of the insulating board 14 in the metal foil wire 16 by a drill or a punch. As in the terminal insertion through-holes 17b in a lower portion of the board illustrated in FIG. 2A, holes are formed corresponding to the terminal insertion through-holes 17b which are not electrically connected to the metal foil wire 16, and have the substantially same shape as that of the terminal insertion through-hole 17b.

Figure 4:
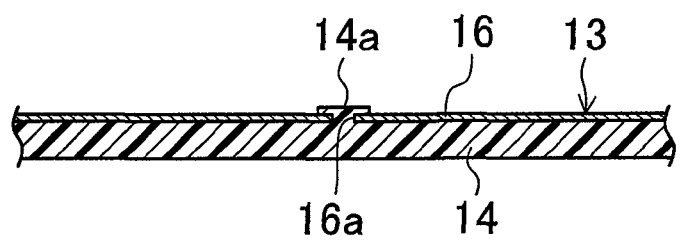
FIG. 4 is a partial cross-sectional view illustrating a structure in which a metal foil wire is attached to the insulating board of the circuit board.
Figure 5:
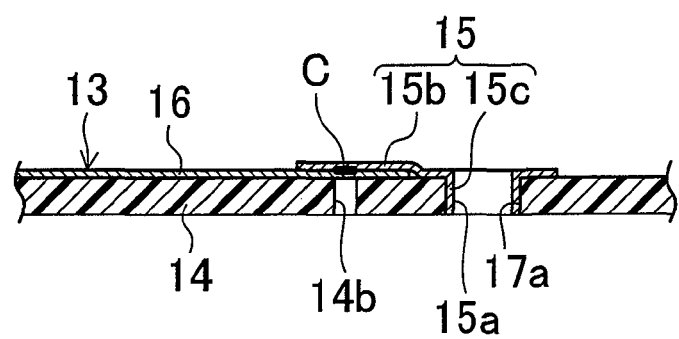
FIG. 5 is a partial cross-sectional view illustrating a structure in which a receiving terminal is attached to the metal foil wire of the circuit board.

The positioning protrusion 14a is inserted into the positioning hole 16a, and a top portion of the positioning protrusion 14a is flattened out so that the positioning protrusion 14a does not come out from the positioning hole 16a as illustrated in FIG. 4. In such a manner, the metal foil wire 16 is integrally provided with the insulating board 14 in the circuit board 13. In addition, the metal foil wire 16 may be bonded to the insulating board 14 with an adhesive. As illustrated in FIG. 5, the receiving terminal 15 is welded to each end of the metal foil wire 16 in a welding portion C corresponding to the terminal welding hole 14b.

The receiving terminal 15 is, e.g., a copper plate formed by the blanking. The thickness of the receiving terminal 15 is, e.g., 0.1-3.0 mm. A terminal holding through-hole 15a is formed corresponding to the terminal insertion through-hole 17a of the insulating board 14 in the receiving terminal 15. The receiving terminal 15 includes a board surface side portion 15b provided on a board surface, and a circular terminal holding portion 15c which continues to the board surface side portion 15b and is fitted into the terminal insertion through-hole 17a to form the terminal holding through-hole 15a.

In the board assembly 11, the plurality of circuit boards 13 are stacked. The board assembly 11 includes, e.g., two to ten circuit boards 13, and preferably three to seven circuit boards 13. The thickness of the board assembly 11 is 2-50 mm, and preferably 5-20 mm. It is preferred that, in order to reduce or prevent a short circuit between the metal foil wires 16 of the circuit boards 13 adjacent to each other, the circuit boards 13 of the board assembly 11 are stacked so that a side of one circuit board 13, on which the metal foil wire 16 is provided faces a side of an adjacent circuit board 13, on which the metal foil wire 16 is not provided. However, if an electric connection between the metal foil wires 16 of the circuit boards 13 adjacent to each other is required, or insulation can be ensured by interposing insulating material therebetween, the circuit boards 13 may be stacked so that sides of the circuit boards 13, on which the metal foil wires 16 are provided face each other.

Figure 6A:
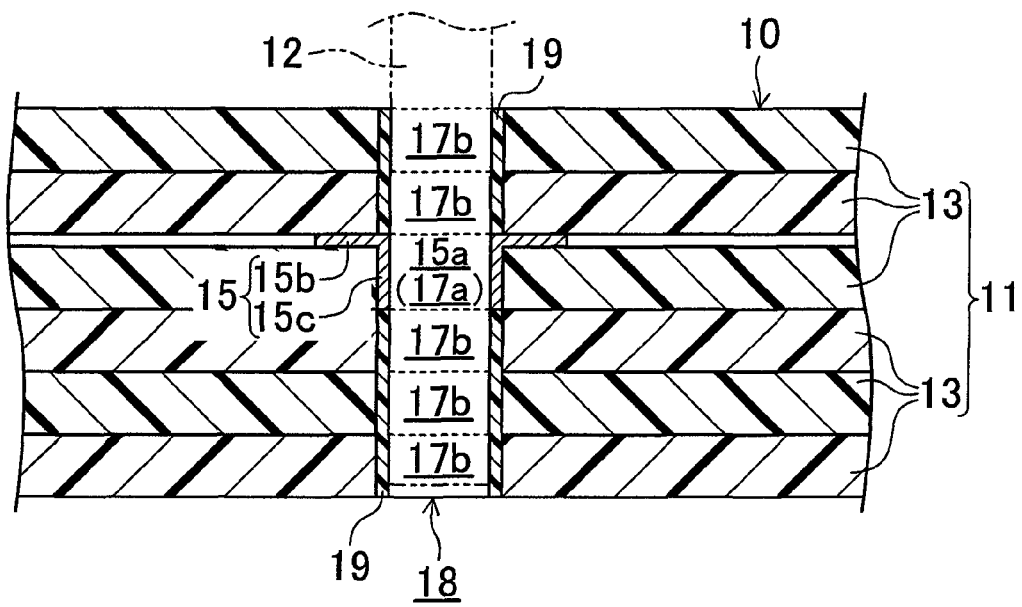
FIGS. 6A and 6B are partial cross-sectional views of a wiring structure.
Figure 6B:
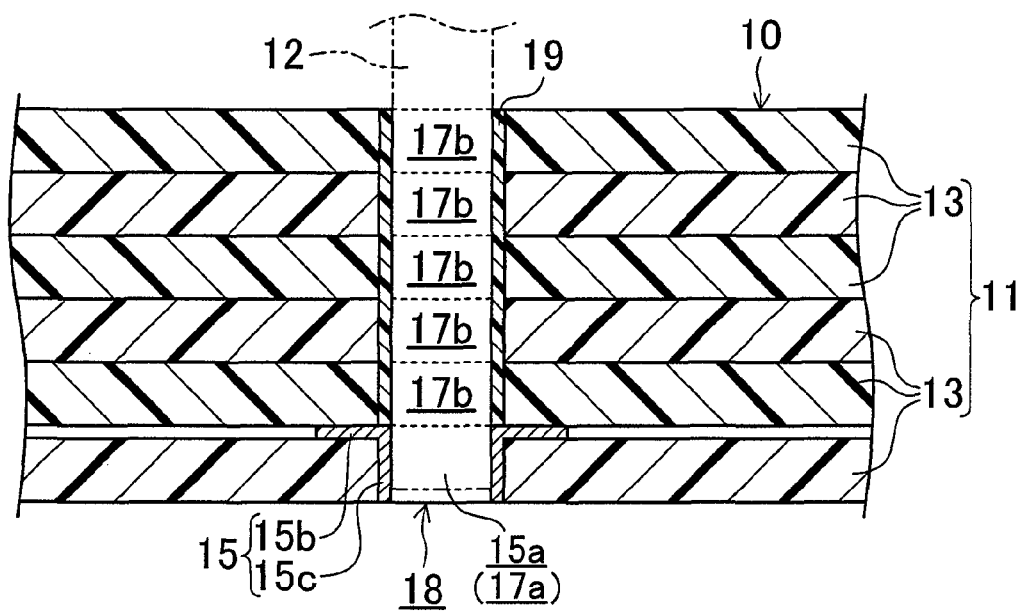

In the board assembly 11, a plurality of pin terminal insertion holes 18 are provided, each of which is formed by overlapping the terminal insertion through-holes 17b or the terminal holding through-holes 15a formed in the plurality of circuit boards 13 in a board thickness direction. In each of the plurality of pin terminal insertion holes 18, the terminal holding portion 15c of the receiving terminal 15 is provided in the terminal holding through-hole 15a of at least one of the plurality of circuit boards 13, which forms a part of the pin terminal insertion hole 18, whereas an insulating sleeve(s) 19 is/are fitted into the terminal insertion through-holes 17b of the other circuit boards 13, which form the remaining part of the pin terminal insertion hole 18. As illustrated in, e.g., FIG. 6A, in any one of the pin terminal insertion holes 18 of the board assembly 11 in which first to sixth circuit boards 13 are stacked in this order from above, the receiving terminal 15 is provided in the third circuit board 13 to form the terminal holding through-hole 15a, and the terminal insertion through-hole 17b is formed in each of the first, second, and fourth to sixth circuit boards 13. In such a configuration, a single upper insulating sleeve 19 is fitted into the terminal insertion through-holes 17b of the first and second circuit boards 13, and a single lower insulating sleeve 19 is fitted into the terminal insertion through-holes 17b of the fourth to sixth circuit boards 13. As illustrated in FIG. 6B, in a configuration in which the receiving terminal 15 is provided in the sixth circuit board 13 to form the terminal holding through-hole 15a, and the terminal insertion through-holes 17b are formed in the first to fifth circuit boards 13, a single insulating sleeve 19 is fitted into the terminal insertion through-holes 17b of the first to fifth circuit boards 13.

Figure 7:
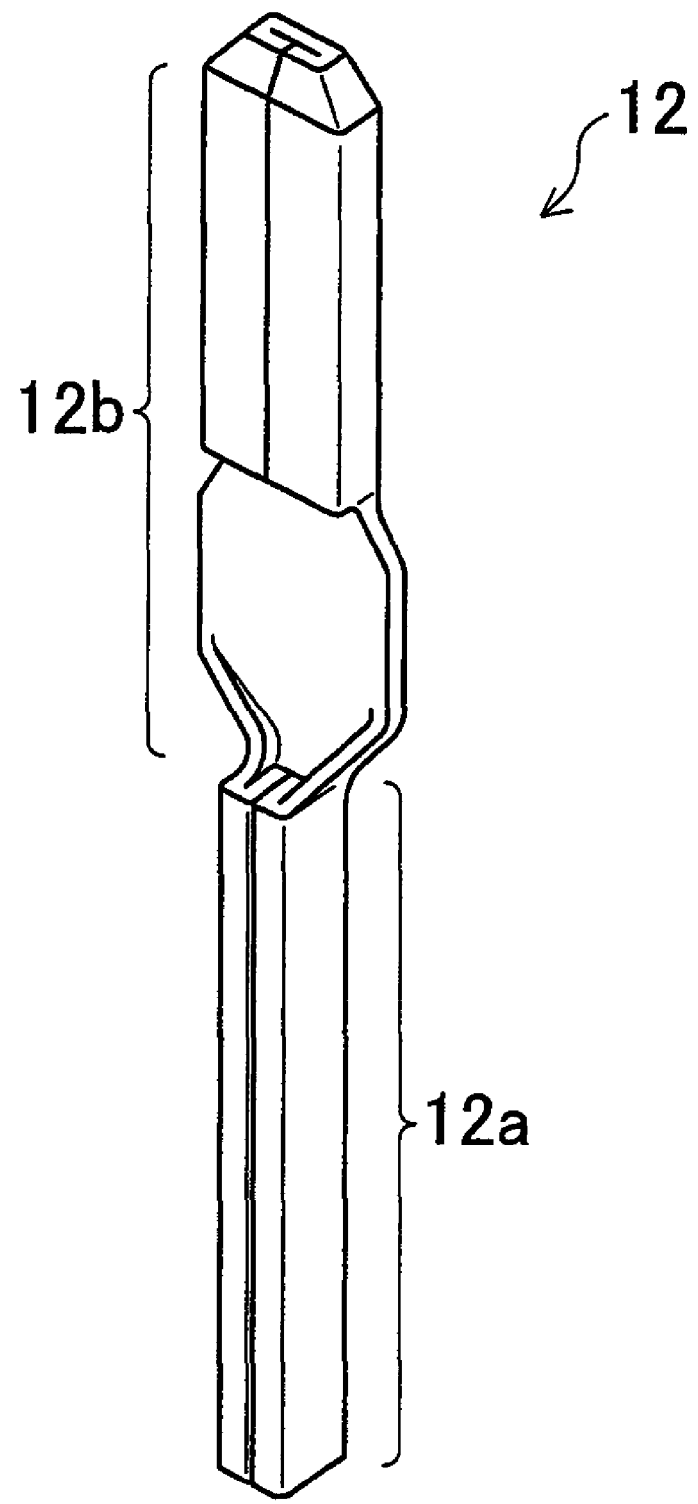
FIG. 7 is a perspective view of a pin terminal.

Various shapes may be employed for the pin terminal 12 depending on an application purpose thereof, and Japanese Patent Publication No. 2009-164632 and Japanese Patent No. 3974924 disclose various types of the pin terminal 12. As illustrated in FIG. 7, the pin terminal 12 includes a pin portion 12a to be inserted into the pin terminal insertion hole 18 of the board assembly 11, and a terminal portion 12b outwardly protruding from the board assembly 11. Note that, as the pin terminal 12, a pin terminal including a pin portion 12a penetrating the board assembly 11 and outwardly protruding from board assembly 11 may be used. Alternatively, as the pin terminal 12, a pin terminal (e.g., a ground bus terminal) which is uniformly formed in a length direction thereof and includes terminal portions 12b outwardly protruding from both sides of the board assembly 11 at both ends thereof may be used.

Each of the plurality of pin terminals 12 is inserted into the pin terminal insertion hole 18 of the board assembly 11. Some of the pin terminals 12 protrude from one side of the board assembly 11, and the remaining pin terminals 12 protrude from the other side of the board assembly 11. Note that a configuration may be employed, in which all of the terminal portions 12b of the plurality of pin terminals 12 protrude from only one side of the board assembly 11. The pin terminals 12 are not inserted into all of the pin terminal insertion holes 18, and there may be the pin terminal insertion holes 18 into which the pin terminals 12 are not inserted.

In a configuration in which pin terminals are inserted into pin terminal insertion holes of a board assembly as described in Japanese Patent Publication No. 2009-164632, if a through-hole is provided in a portion where a metal foil wire is provided in a circuit board other than a circuit board in which the pin terminal is electrically connected to a metal foil wire, it is necessary to avoid contact between the metal foil wire and the pin terminal. Thus, e.g., a technique has been employed, in which a hole of the metal foil wire is formed larger than the through-hole, and a rim of the hole of the metal foil wire is apart from a rim of the through-hole. However, a larger hole of the metal foil wire than the through-hole results in a smaller area of the metal foil wire, thereby increasing conductor resistance of the metal foil wire and reducing heat radiation.

On the other hand, according to the configuration of the present disclosure, in the pin terminal insertion hole 18 into which the pin terminal 12 is inserted, the terminal holding through-hole 15a forming a part of the pin terminal insertion hole 18 is formed in at least one of the plurality of circuit boards 13. In the terminal holding through-hole 15a, a terminal connection portion is provided, which is electrically connected to the metal foil wire 16 of the circuit board 13 and is fitted onto the pin terminal 12 inserted into the pin terminal insertion hole 18 so as to hold the pin terminal 12. In addition, the insulating sleeve(s) 19 is/are fitted into the terminal insertion through-holes 17b of the remaining circuit boards 13, which form the remaining part of the pin terminal insertion hole 18, so that contact of the pin terminal 12 inserted into the pin terminal insertion hole 18 with the remaining circuit boards 13 is blocked. Thus, in each of the circuit boards 13 other than the circuit board 13 including the metal foil wire 16 electrically connected to the pin terminal 12, avoidance of contact between the metal foil wire 16 and the pin terminal 12 can be ensured. As a result, in each of the circuit boards 13 other than the circuit board 13 including the metal foil wire 16 electrically connected to the pin terminal 12, the metal foil wire 16 can be provided near an edge of the terminal insertion through-hole 17b as in the terminal insertion through-holes 17b provided on the lower portion of the board illustrated in FIG. 2A, thereby reducing conductor resistance of the metal foil wire 16 and enhancing heat radiation.

Figure 8A:
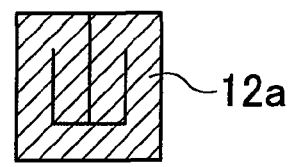
FIGS. 8A-8E are cross-sectional views of a pin portion of the pin terminal.
Figure 8B:
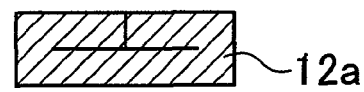
Figure 8C:
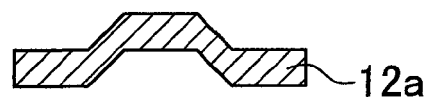
Figure 8D:
Figure 8E:
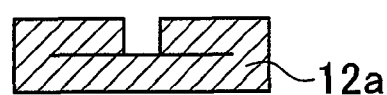

The pin terminal 12 is, e.g., a member formed by processing a metal plate. For example, the following configurations may be employed for the pin terminal 12: a configuration in which both side end portions of a band-shaped metal plate (i.e., the pin portion 12a) are inwardly folded two times, and the metal plate has a rectangular cross section as illustrated in FIG. 8A; a configuration in which both side end portions of a band-shaped metal plate are inwardly folded so that side ends of the metal plate face each other as illustrated in FIG. 8B; a configuration in which a band-shaped metal plate is curved so as to have a step extending in a thickness direction thereof and has a substantially trapezoidal cross section as illustrated in FIG. 8C; a configuration in which a band-shaped metal plate is used without any processing as illustrated in FIG. 8D; and a configuration in which both side end portions of a band-shaped metal plate are inwardly folded so that there is a clearance between ends of the metal plate as illustrated in FIG. 8E. As material of the metal plate, e.g., copper, copper alloy, metal material coated with copper, etc. may be employed. Alternatively, material coated with Sn (tin) plating may be employed as necessary. The thickness and width of the band-shaped metal plate are arbitrarily set depending on the capacity of current flowing through a produced terminal.

Figure 9A:
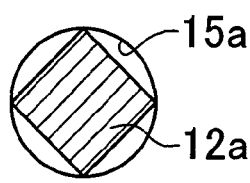
FIGS. 9A and 9B are views illustrating a state in which the pin terminal is inserted into a terminal holding through-hole.
Figure 9B:
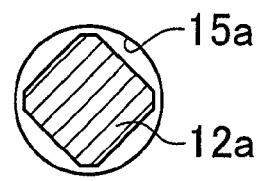

It is preferred that the pin terminal 12 is electrically connected to the metal foil wire 16 of only one of the plurality of circuit boards 13. It is possible to realize a structure in which the pin terminal 12 inserted into the pin terminal insertion hole 18 is electrically connected to the metal foil wires 16 of the plurality of the circuit boards 13. However, in such a structure, the terminal holding portions 15c of a plurality of the receiving terminals 15 are fitted onto the pin terminal 12 inserted into the pin terminal insertion hole 18, thereby holding the pin terminal 12. Thus, a portion of the pin terminal 12 may be plastically deformed after the pin terminal 12 passes through the terminal holding portion 15c of the receiving terminal 15 which first contacts the pin terminal 12. As a result, there is a possibility that reliability of electrical contact between the pin terminal 12 and each of the terminal holding portions 15c of the receiving terminals 15 which subsequently contacts the pin terminal 12 is reduced. For example, in a case where a pin terminal 12 is inserted into a circular pin terminal insertion hole 18, the pin terminal 12 is held in a state in which a four corners thereof contact an inner surface of the pin terminal insertion hole 18 in the terminal holding portion 15c of the receiving terminal 15 which first contacts the pin terminal 12 as illustrated in FIG. 9A. However, if the corners are plastically deformed in the receiving terminal 15 which first contacts the pin terminal 12, there is a possibility that the four corners do not contact the inner surface of the pin terminal insertion hole 18 in the terminal holding portions 15c of the receiving terminals 15 through which the pin terminal 12 subsequently passes as illustrated in FIG. 9B. On the other hand, the pin terminal 12 is electrically connected only to the metal foil wire 16 of at least one of the plurality of circuit boards 13, thereby obtaining high reliability of electrical contact between the pin terminal 12 and the metal foil wire 16.

Figure 10A:
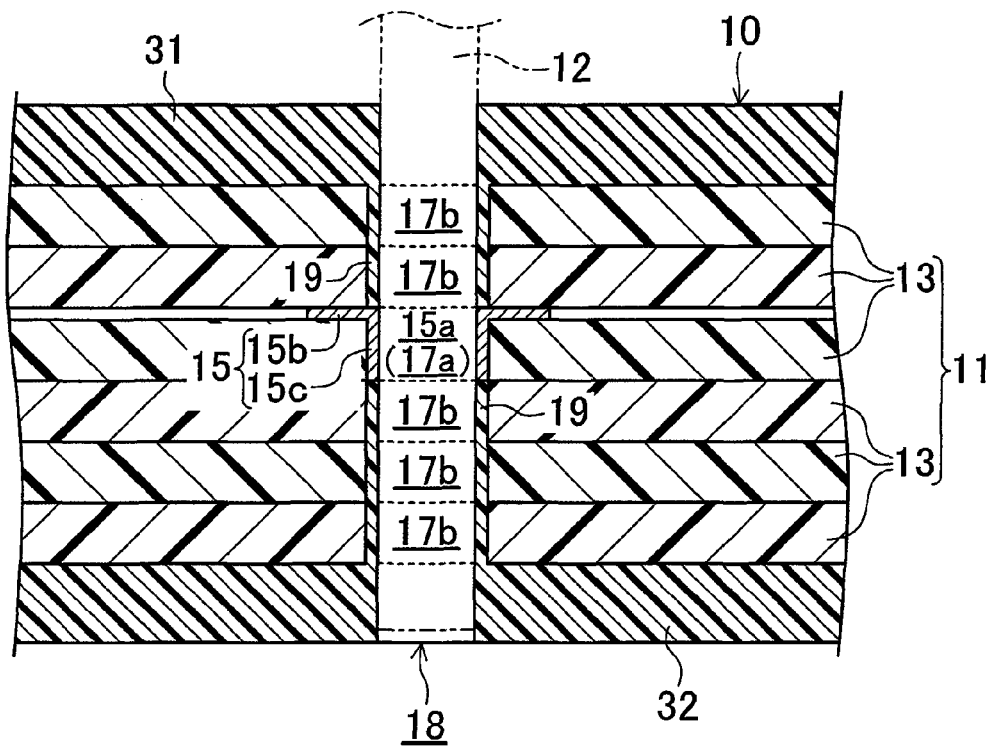
FIGS. 10A and 10B are partial cross-sectional views of variations of the wiring structure.
Figure 10B:
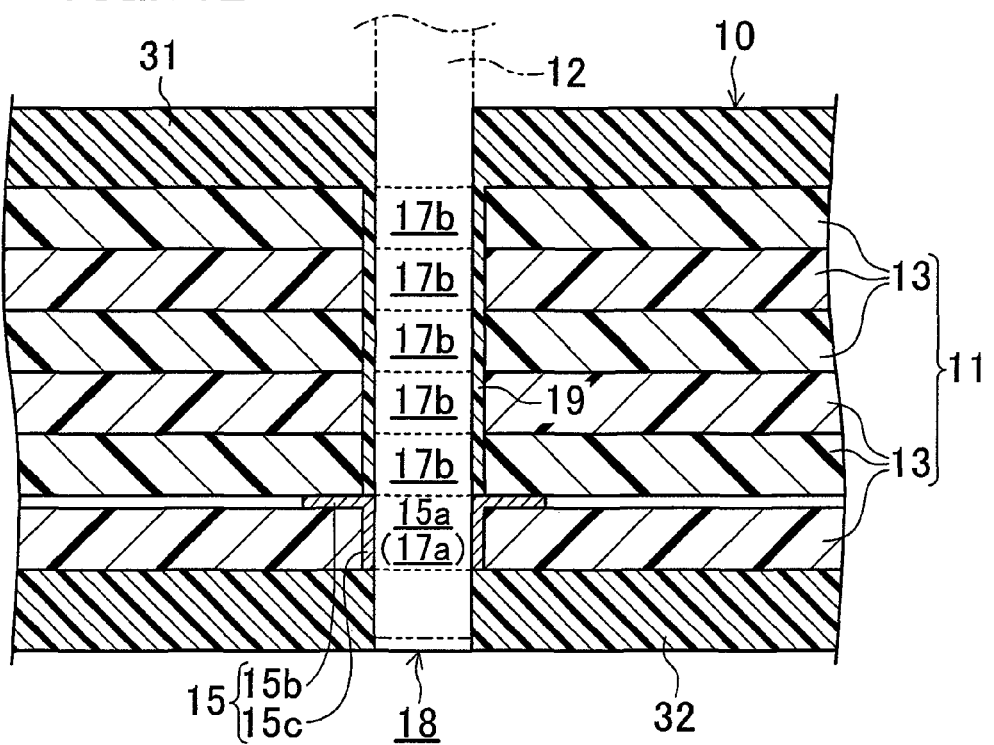

As illustrated in FIGS. 10A and 10B, the wiring structure 10 preferably includes plate-shaped upper and lower protective members 31, 32 provided so as to sandwich the board assembly 11. In each of the upper and lower protective members 31, 32, a terminal insertion portion is formed corresponding to the pin terminal insertion hole 18, and the pin terminal 12 protrudes from the terminal insertion portion in a state in which the pin terminal 12 is inserted into the pin terminal insertion hole 18.

Each of the upper and lower protective members 31, 32 is made of, e.g., resin material. The resin material may be thermoplastic resin such as polypropylene resin and ABS resin, or may be thermoset resin such as epoxy resin. However, if the thermoset resin is used, cutting etc. are required when forming recessed and raised portions, thereby complicating a board forming process and wasting material. Thus, the thermoplastic resin is preferably used because the recessed and raised portions can be easily formed in the board by injection molding using a mold devised for forming the recessed and raised portions and no material is wasted. The thickness of each of the upper and lower protective members 31, 32 is, e.g., 1-5 mm.

Figure 11:
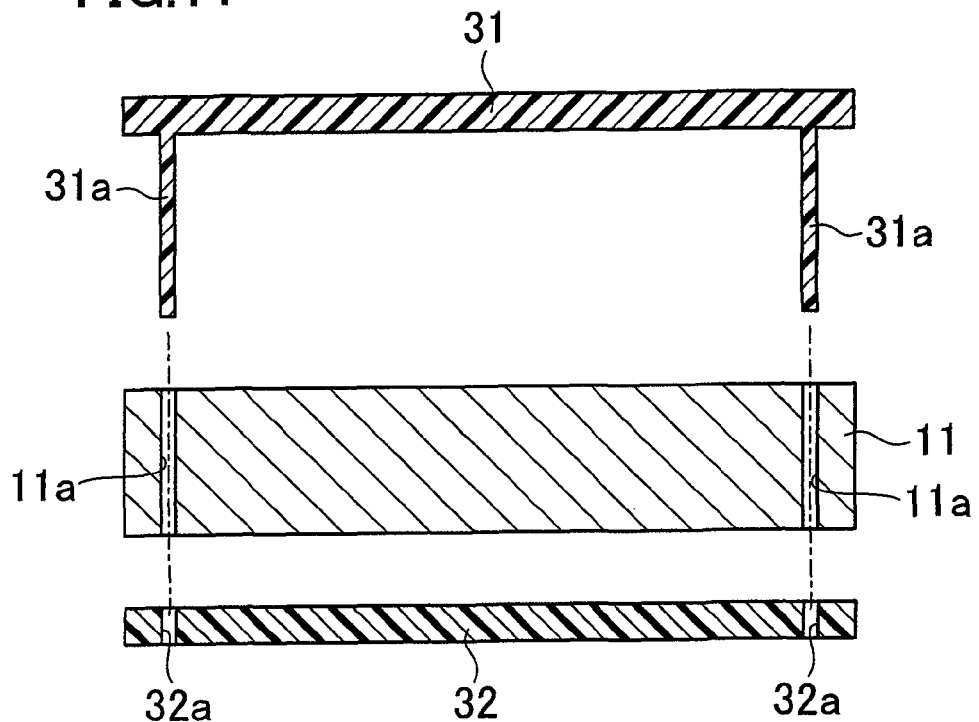
FIG. 11 is a view illustrating a structure in which a board assembly is attached to upper and lower protective members.

The following configuration may be employed for the upper and lower protective members 31, 32. As illustrated in FIG. 11, positioning protrusions 31a are formed in the upper protective member 31, and positioning holes 32a are formed corresponding to the positioning protrusions 31a in the lower protective member 32. Protrusion insertion holes 11a are formed in each of the plurality of circuit boards 13 forming the board assembly 11 so as to correspond to the positioning protrusions 31a. The positioning protrusion 31a penetrates the protrusion insertion holes 11a of the plurality of circuit boards 13 of the board assembly 11 and the positioning hole 32a, and a top portion of the positioning protrusion 31a is flattened out or welded. The board assembly 11 is packed within the upper and lower protective members 31, 32, and is integrated with the upper and lower protective members 31, 32. According to the foregoing configuration, the metal foil wires 16 of the circuit boards 13 and the receiving terminals 15 can be protected without being exposed. Note that a configuration may be employed, in which positioning protrusions are formed in the lower protective member 32, and positioning holes are formed corresponding to the positioning protrusions in the upper protective member 31.

Ribs are preferably provided in, e.g., a grid pattern on an outer surface of each of the upper and lower protective members 31, 32. According to such a configuration, warpage of the board assembly 11 can be avoided by a reinforcement effect of the ribs. Note that the warpage of the board assembly 11 may degrade workability for positioning the board assembly 11 within the housing 20.

It is preferred that the insulating sleeve 19 is integrally formed with the upper and/or lower protective members 31, 32. As illustrated in, e.g., FIG. 10A, in any one of the pin terminal insertion holes 18 of the board assembly 11 in which first to sixth circuit boards 13 are stacked in this order from above, the receiving terminal 15 is provided in the third circuit board 13 to form the terminal holding through-hole 15a, and the terminal insertion through-hole 17b is formed in each of the first, second, and fourth to sixth circuit boards 13. In such a configuration, a single insulating sleeve 19 integrally formed with the upper protective member 31 is fitted into the terminal insertion through-holes 17b of the first and second circuit boards 13, and a single insulating sleeve 19 integrally formed with the lower protective member 32 is fitted into the terminal insertion through-holes 17b of the fourth to sixth circuit boards 13. As illustrated in FIG. 10B, the receiving terminal 15 is provided in the sixth circuit board 13 to form the terminal holding through-hole 15a, and the terminal insertion through-holes 17b are formed in the first to fifth circuit boards 13. In such a configuration, a single insulating sleeve 19 integrally formed with the upper protective member 31 is fitted into the terminal insertion through-holes 17b of the first to fifth circuit boards 13.

The housing 20 includes an upper housing member 21 provided above the wiring structure 10, and a lower housing member 22 provided below the wiring structure 10. Each of the upper and lower housing members 21, 22 is made of, e.g., resin material. The resin material may be thermoplastic resin such as polypropylene resin and ABS resin, or may be thermoset resin such as epoxy resin. However, if the thermoset resin is used, cutting etc. are required when forming recessed and raised portions, thereby complicating a board forming process and wasting material. Thus, the thermoplastic resin is preferably used because the recessed and raised portions can be easily formed in the board by injection molding using a mold devised for forming the recessed and raised portions and no material is wasted. The thickness of each of the upper and lower housing members 21, 22 is, e.g., 1-5 mm.

Figure 12:
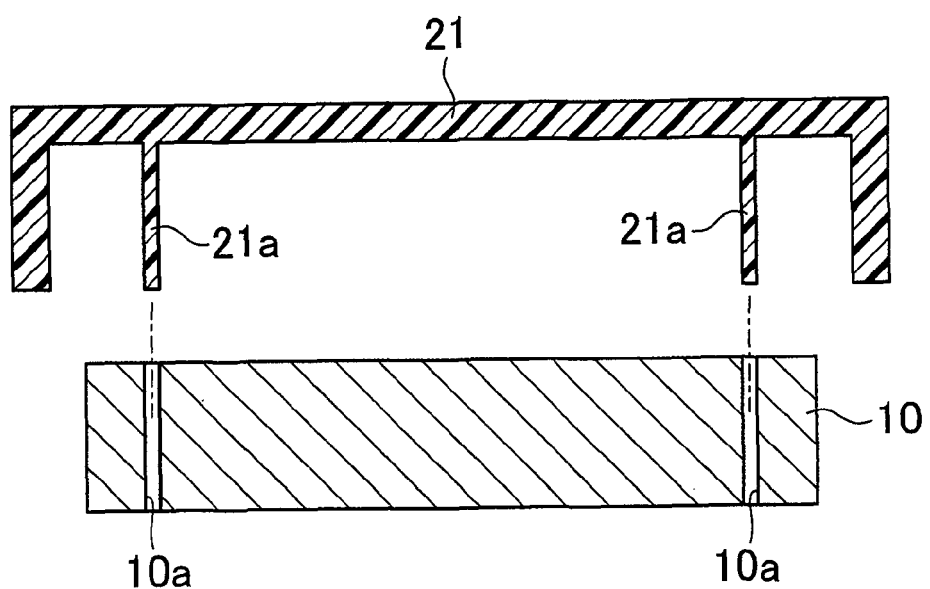
FIG. 12 is a view illustrating a structure in which the wiring structure is attached to an upper housing member.

As illustrated in FIG. 12, attachment protrusions 21a are formed in the upper housing member 21, and attachment holes 10a are formed corresponding to the attachment protrusions 21a in the wiring structure 10. The attachment protrusion 21a penetrates the wiring structure 10 through the attachment hole 10a, and a top portion of the attachment protrusion 21a is flattened out or welded. In such a manner, the wiring structure 10 is integrally attached to the upper housing member 21. Note that a configuration may be employed, in which the wiring structure 10 is integrally attached to the lower housing member 22.

In each of the upper and lower housing members 21, 22, terminal insertion portions are formed corresponding to the pin terminal insertion holes 18 of the wiring structure 10, and the terminal portions 12b of the pin terminals 12 of the wiring structure 10 protrude from the terminal insertions portions in a state in which the pin terminals 12 are inserted into the pin terminal insertion holes 18. In an outer surface of each of the upper and lower housing members 21, 22, a plurality of connector attachment portions 23 are provided, each of which includes walls surrounding one or more pin terminals 12 protruding from the terminal insertion portion(s) and/or one or more terminal insertion portions from which the pin terminal(s) 12 does/do not protrude. A connector provided in each of many wires extending from electronic parts etc. is connected to each of the connector attachment portions 23.

In the outer surface of the upper housing member 21, a board attachment portion 24 is provided with walls surrounding one or more pin terminals 12 protruding from the terminal insertion portion(s) and/or one or more terminal insertion portions from which the pin terminal(s) 12 does/do not protrude. A circuit board 25 on which electrical components 25a are mounted is provided in the board attachment portion 24. The circuit board 25 includes a terminal receiving portion(s) provided corresponding to the pin terminal(s) 12 within the board attachment portion 24, and a pin terminal(s) 12 provided corresponding to the terminal insertion portion(s) from which the pin terminal(s) 12 does/do not protrude. The terminal receiving portion of the circuit board 25 holds the pin terminal 12 protruding from the terminal insertion portion of the upper housing member 21. In addition, the pin terminal 12 of the circuit board 25 is held in a state in which the pin terminal 12 of the circuit board 25 is inserted into the pin terminal insertion hole 18 through the terminal insertion portions of the upper housing member 21 and the upper protective member 31, thereby being directly and electrically connected to the wiring structure 10. In such a manner, the circuit board 25 is attached to the wiring structure 10 through the upper housing member 21. The pin terminal 12 and the terminal receiving portion may be fixed to each other by solder. Note that, e.g., a voltage control circuit board, a ground-fault detection circuit board, etc. may be employed as the circuit board 25. Alternatively, a configuration may be employed, in which the circuit board 25 is provided in the lower housing member 22.

Figure 13:
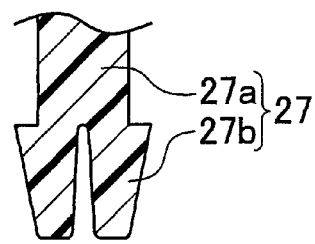
FIG. 13 is a front view of a board engaging protrusion.
Figure 14:
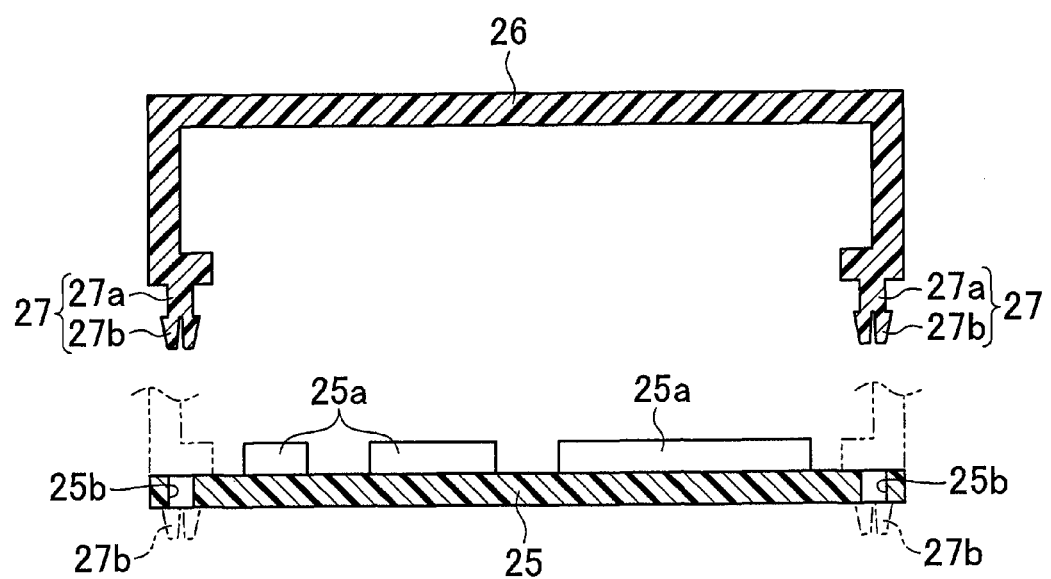
FIG. 14 is a view illustrating a structure in which a circuit board is attached to a board cover.

A board cover 26 is provided in the upper housing member 21 so as to cover the board attachment portion 24. The board cover 26 is preferably made of resin material similar to that of the upper housing member 21. A plurality of board engaging protrusions 27 are provided on a side closer to the upper housing member 21 in the board cover 26. As illustrated in FIG. 13, in the board engaging protrusion 27, a top portion 27b formed in a circular truncated cone shape is integrally provided at a tip end of a protrusion body 27a. A notch is formed so as to vertically divide the top portion 27b from a side closer to a top surface thereof, and therefore the top portion 27b can be elastically contracted so that the outer diameter thereof is reduced. As illustrated in FIG. 14, protrusion insertion holes 25b are formed corresponding to the board engaging protrusions 27 in the circuit board 25. The circuit board 25 is engaged with and fixed to the board cover 26 by snap-fitting by which the board engaging protrusion 27 is inserted into the protrusion insertion hole 25b in a state in which the outer diameter of the top portion 27b is reduced, followed by returning the shape of the top portion 27b prior to the elastic contraction. Thus, in a state in which the circuit board 25 is engaged with and fixed to the board cover 26 to form an unit, the circuit board 25 is attached to the board attachment portion 24 of the upper housing member 21. According to such a configuration, since the circuit board 25 is engaged with and fixed to the board cover 26, the circuit board 25 is easily attached to the board cover 26, and the board cover 26 can be reused when replacing the circuit board 25.

Guide protrusions 28 are provided in the board cover 26, and guide grooves (not shown in the figure) to be engaged with the guide protrusions 28 are provided in the upper housing member 21. According to such a configuration, disadvantages such as the tilted board cover 26 attached to the upper housing member 21 can be solved. Thus, attachment of the board cover 26 to the upper housing member 21 is facilitated, and shape retention of the board cover 26 can be realized by the guide protrusions 28. It is preferred that a vent hole (not shown in the figure) for enhancing the heat radiation, a reinforcement rib (not shown in the figure) for shape retention, which is attached to an inner surface of the board cover 26, and an engagement/fixing portion (not shown in the figure) for the upper housing member 21 are provided in the board cover 26.

A switch attachment portion 29 including one or more pin terminals 12 protruding from the terminal insertion portion(s) of the upper housing member 21 and/or one or mere terminal insertion portions of the upper housing member 21 from which the pin terminal(s) 12 does/do not protrude is provided in the upper housing member 21. A switching component for switching voltage is directly attached to the switch attachment portion 29 or is attached to the switch attachment portion 29 through a relay connector, and therefore the switching component is electrically connected to the circuit board 25.

The description of the embodiment of the present disclosure is given above for the understanding of the present disclosure. It will be understood that the invention is not limited to the particular embodiment described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A wiring structure, comprising:
a board assembly in which a plurality of circuit boards each including a metal foil wire on an insulating board are stacked, and a pin terminal insertion hole is formed by overlapping through-holes formed in the plurality of circuit boards with each other in a board thickness direction; and
a pin terminal inserted into the pin terminal insertion hole of the board assembly,
wherein, in the pin terminal insertion hole, a terminal connection portion electrically connected to the metal foil wire of the circuit board and fitted onto the pin terminal inserted into the pin terminal insertion hole so as to hold the pin terminal is provided in the through-hole of at least one of the plurality of circuit boards, which forms a part of the pin terminal insertion hole, and at least one insulating sleeve blocking contact of the pin terminal inserted into the pin terminal insertion hole with the remaining circuit boards is fitted into the through-holes of the remaining circuit boards, which form the remaining part of the pin terminal insertion hole.

2. The wiring structure of claim 1, wherein
the plurality of circuit boards are stacked so that a side of one of the circuit boards, on which the metal foil wire is provided and a side of the adjacent circuit board, on which the metal foil wire is not provided face each other.

3. The wiring structure of claim 1, wherein
the plurality of circuit boards includes a circuit board having metal foil wires on both sides of an insulating board.

4. The wiring structure of claim 1, wherein
each of the insulating boards of the plurality of circuit boards is made of polypropylene resin.

5. The wiring structure of claim 1, wherein
an inter-board clearance maintaining raised portion is provided around each of the through-holes of the remaining circuit boards, which form the remaining part of the pin terminal insertion hole.

6. The wiring structure of claim 1, wherein
the pin terminal is electrically connected to the metal foil wire of only one of the plurality of circuit boards.

7. The wiring structure of claim 1, wherein,
the board assembly includes a plurality of pin terminal insertion holes, and a plurality of pin terminals is provided.

8. The wiring structure of claim 7, wherein
the plurality of pin terminals includes a pin terminal penetrating the board assembly and outwardly protruding from the board assembly.

9. The wiring structure of claim 7, wherein
the plurality of pin terminals includes a pin terminal protruding from one side of the board assembly, and a pin terminal protruding from the other side of the board assembly.

10. The wiring structure of claim 7, wherein
the plurality of pin terminals are provided so as to protrude only from one side of the board assembly.

11. The wiring structure of claim 1, further comprising:
upper and lower protective members from which the pin terminal protrudes and which are provided so as to sandwich the board assembly,
wherein the insulating sleeve is integrally provided in at least one of the upper and lower protective members.

12. The wiring structure of claim 11, wherein
a rib is provided on an outer surface of each of the upper and lower protective members.

13. A joint box, comprising:
a board assembly in which a plurality of circuit boards each including a metal foil wire on an insulating board are stacked, and a pin terminal insertion hole is formed by overlapping through-holes formed in the plurality of circuit boards with each other in a board thickness direction;
a pin terminal inserted into the pin terminal insertion hole of the board assembly;
a wiring structure in which, in the pin terminal insertion hole, a terminal connection portion electrically connected to the metal foil wire of the circuit board and fitted onto the pin terminal inserted into the pin terminal insertion hole so as to hold the pin terminal is provided in the through-hole of at least one of the plurality of circuit boards, which forms a part of the pin terminal insertion hole, and at least one insulating sleeve blocking contact of the pin terminal inserted into the pin terminal insertion hole with the remaining circuit boards is fitted into the through-holes of the remaining circuit boards, which form the remaining part of the pin terminal insertion hole; and a housing in which the wiring structure is accommodated so that the pin terminal protrudes from the housing, wherein a connector attachment portion including the pin terminal protruding from the housing is provided on an outer surface of the housing.

14. The joint box of claim 13, wherein a board attachment portion including the pin terminal protruding from the housing is provided on the outer surface of the housing, and a circuit board including a terminal receiving portion which holds the pin terminal and is electrically connected to the pin terminal is provided in the board attachment portion.

* * * * *